(12) United States Patent
Takeda

(10) Patent No.: US 6,943,649 B2
(45) Date of Patent: Sep. 13, 2005

(54) SURFACE ACOUSTIC WAVE FILTER WITH A GROUND PATTERN PARTIALLY SURROUNDING A SIGNAL PAD AND COMMUNICATION DEVICE USING SAME

(75) Inventor: Mitsuo Takeda, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/652,808

(22) Filed: Aug. 29, 2003

(65) Prior Publication Data

US 2004/0080384 A1 Apr. 29, 2004

(30) Foreign Application Priority Data

Aug. 29, 2002 (JP) ........................................ 2002-252071

(51) Int. Cl.[7] .............................. H03H 9/64; H03H 9/72
(52) U.S. Cl. ...................... 333/193; 333/195; 333/133; 310/313 B
(58) Field of Search ................................. 333/193–196, 333/133; 310/313 B, 313 D

(56) References Cited

U.S. PATENT DOCUMENTS 6,310,422 B1 * 10/2001 Satoh et al. ............ 310/313 R

FOREIGN PATENT DOCUMENTS

| EP | 1 030 448 A1 | * | 8/2000 |
| JP | 5-183380 | | 7/1993 |
| JP | 7-154201 | | 6/1995 |
| JP | 9-199986 | * | 7/1997 |
| JP | 2000-196400 | * | 7/2000 |
| JP | 2000-341080 | * | 12/2000 |

* cited by examiner

*Primary Examiner*—Barbara Summons
(74) *Attorney, Agent, or Firm*—Keating & Bennett, LLP

(57) ABSTRACT

A surface acoustic wave filter includes multiple serial surface acoustic wave resonators and parallel surface acoustic wave resonators arranged in a ladder configuration between an input electrode pad and an output electrode pad on a piezoelectric substrate, and a grounded electrode pattern is arranged on the piezoelectric substrate so as to surround at least one of the input electrode pad and the output electrode pad. This provides a small-sized surface acoustic wave filter with improved attenuation near the pass band on the high-frequency side.

17 Claims, 19 Drawing Sheets

SURFACE ACOUSTIC WAVE FILTER WITH A GROUND PATTERN PARTIALLY SURROUNDING A SIGNAL PAD AND COMMUNICATION DEVICE USING SAME

BACKGROUND OF THE INVENTION

1. Field of the Invention

The present invention relates to a surface acoustic wave filter used for a band filter, and more particularly to a ladder surface acoustic wave filter including multiple single-port surface acoustic wave resonators.

2. Description of the Related Art

In recent years, technology in the field of reduction of the size and weight of communication devices such as cellular phones has made remarkable progress. As filters used for such communication devices, surface acoustic wave filters are being used more often due to the small size and weight thereof while still being able to meet the demand for a high operation frequency band.

A ladder bandpass filter including single-port surface acoustic wave resonators that are connected with alternating serial arms and parallel arms is disclosed in Japanese Unexamined Patent Application Publication No. 5-183380. With this ladder filter, first single-port surface acoustic wave resonators are serially connected, and second single-port surface acoustic wave resonators are connected in parallel, wherein the antiresonant frequency of the parallel resonators is substantially matched with the resonant frequency of the serial resonators. With this configuration, a filter having outstanding properties, such as low loss and a wide band width, is obtained.

Furthermore, a filter with a high frequency band is obtained by adding serial inductors to the serial resonators or the parallel resonators.

However, in general, not only a wide frequency band width but also an excellent reflection property and acute and deep attenuation property near the pass band are required. In particular, increased attenuation is required in the diplex band, and the closer the pass band is to the diplex band, the more the attenuation property must be increased. For example, when the Rx frequency band is close to the pass band on the high-frequency side, such as in a PCS-Tx RF filter, the attenuation properties of the filter near the pass band width on the high-frequency side must be increased.

Furthermore, a surface acoustic wave filter is described in Japanese Unexamined Patent Application Publication No. 7-154201, wherein vertical connection steps of the surface acoustic resonators are increased in a chip having a conventional chip size. In this case, a problem is described wherein a direct wave (bridging capacity) from the input electrode pad or output electrode pad to the signal line, or from a serial arm signal line to a parallel arm signal line, prevents sufficient attenuation. In order to solve the aforementioned problem, four methods are disclosed in the aforementioned Publication. The four methods are 1) a method of providing a grounded electrode pattern between the input electrode pad or the output electrode pad and the signal line, 2) a method wherein, in a surface acoustic wave filter in which at least two surface acoustic wave resonators are serially connected with serial arms, grounded electrode patterns are provided between the surface acoustic wave resonators connected to the serial arms, 3) a method of providing a grounded electrode pattern between the serial arm signal line and the parallel arm signal line, or between the parallel arm signal line and the parallel arm signal line adjacent thereto, and 4) a method wherein, in a surface acoustic wave filter in which serial-arm surface acoustic wave resonators and parallel-arm surface acoustic wave resonators are disposed at positions adjacent to one another, in parallel with the surface acoustic wave transmission direction, a grounded electrode pattern is provided between the serial-arm surface acoustic wave resonator and the parallel-arm surface acoustic wave resonator.

However, with the methods disclosed in Japanese Unexamined Patent Application Publication No. 7-154201, the direct wave is only reduced between the input electrode pad or the output electrode pad and the signal line, between the serial resonators which are serially connected, between the serial-arm signal line and the parallel-arm signal line, between the parallel-arm signal line and another one adjacent thereto, and between the serial resonator and the parallel resonator disposed at positions adjacent to one another in parallel with the surface acoustic wave transmission direction.

On the other hand, the demand for reduction in size of the surface acoustic filter is increasing. In order to reduce the size of the surface acoustic filter, the size of the piezoelectric substrate (chip size) used for the surface acoustic wave filter must be reduced. Such reduction in the chip size causes additional adverse effects. For example, direct waves (bridging capacity) actually arrive. Such direct waves include not only a wave which is directly transmitted between electrodes, but also include a wave which is transmitted by making a detour around the electrode. When the surface acoustic wave filter has a large chip size, the direct wave does not cause a substantial problem. However, when the surface acoustic wave filter has a small chip size, the distance between the electrodes provided on the chip is reduced, and consequently, the influence of the direct wave greatly increases, which leads to a substantial problem. With the surface acoustic wave filter, a large direct wave arriving from the input electrode to the output electrode causes significant effects upon the properties of the surface acoustic wave filter. With the ladder surface acoustic wave filter, in particular, there are significant effects on attenuation near the pass band on the high-frequency side. The arrival of the direct wave is caused by the distance between the electrodes provided on the chip being reduced in the same manner as with the arrangement disclosed in Japanese Unexamined Patent Application Publication No. 7-154201, wherein vertical connection steps are increased in a chip having a conventional chip size.

Here, as an example, FIG. 15 illustrates a schematic configuration of a ladder surface acoustic filter 120 having a conventional chip size (1.05 mm by 1.55 mm). FIG. 16 is a circuit diagram which illustrates the surface acoustic wave filter.

As shown in FIG. 15, the conventional surface acoustic wave filter 120 includes an input electrode pad 113a, an output electrode pad 113b, and grounded electrode pads 114a and 114b, provided on a piezoelectric substrate 110, and furthermore, includes serial resonators 111a through 111c and parallel resonators 112a and 112b arranged in a ladder configuration. The serial resonator 111a is connected to the input electrode pad 113a, and the serial resonator 111c is connected to the output electrode pad 113b. Furthermore, the parallel resonator 112a is connected to the grounded electrode pad 114a, and the parallel resonator 112b is connected to the grounded electrode pad 114b. FIG. 17 illustrates the filter property of the surface acoustic wave filter 120.

On the other hand, FIG. 18 illustrates a schematic configuration of a ladder surface acoustic wave filter 130 having a reduced chip size (0.90 mm by 1.05 mm) with the same configuration as the surface acoustic wave filter 120. FIG. 19 illustrates the filter property of the surface acoustic wave filter 130.

As shown in FIGS. 17 and 19, attenuation near the pass band on the high-frequency side is reduced. This is because the chip size is reduced and the electrode layout is changed, and the distance between the input electrode pad 113a and the output electrode pad 113b is reduced.

SUMMARY OF THE INVENTION

To overcome the problems described above, preferred embodiments of the present invention provide a surface acoustic wave filter having a small size (even where the distance between the input/output electrodes is small) wherein attenuation near the pass band on the high-frequency side is greatly improved.

A surface acoustic wave filter according to a preferred embodiment of the present invention includes a plurality of serial surface acoustic wave resonators and parallel surface acoustic wave resonators arranged in a ladder configuration between an input electrode pad and an output electrode pad on a piezoelectric substrate, and a grounded electrode pattern provided on the piezoelectric substrate so as to surround at least one of the input electrode pad and the output electrode pad.

According to the above-described configuration, even when the size of the surface acoustic wave filter is reduced, the grounded electrode pattern surrounds at least one of the input electrode pad and the output electrode pad, thereby reducing direct waves between the input electrode pad and the output electrode pad (in particular, a direct wave which is transmitted by making a detour around the perimeter (edge) of the piezoelectric substrate 210). Thus, preferred embodiments of the present invention provide a small-sized surface acoustic wave filter with greatly improved attenuation near the pass band on the high-frequency side.

Furthermore, in the surface acoustic wave filter, the grounded electrode pattern is preferably arranged so as to surround both of the input electrode pad and the output electrode pad. With this configuration, the region where the input electrode pad is provided and the region where the output electrode pad is provided are separated on the piezoelectric substrate by the grounded electrode pattern. Thus, direct waves are further reduced.

A surface acoustic wave filter according to another preferred embodiment of the present invention includes multiple serial surface acoustic wave resonators and parallel surface acoustic wave resonators which are arranged in a ladder configuration between an input electrode pad and an output electrode pad on a piezoelectric substrate, and a grounded electrode pattern provided between at least one of the input electrode pad and the output electrode pad, and the edge of the piezoelectric substrate.

According to the above-described configuration, the direct waves between the input electrode pad and the output electrode pad (in particular, a direct wave which is transmitted by making a detour around the perimeter (edge) of the piezoelectric substrate 210) is greatly reduced. Thus, preferred embodiments of the present invention provide a small-sized surface acoustic wave filter with greatly improved attenuation near the pass band on the high-frequency side.

Furthermore, in the surface acoustic wave filter, a portion of the grounded electrode pattern is preferably disposed between the input electrode pad and the output electrode pad, the grounded electrode pattern is preferably arranged along the edge of the piezoelectric substrate, and the serial surface acoustic wave resonators are preferably arranged so as to be substantially linearly arrayed.

A communication device according to another preferred embodiment of the present invention includes any of the above-described surface acoustic wave devices in order to solve the above-described problems. With such a configuration, the communication device includes a surface acoustic wave filter having greatly improved attenuation near the pass band on the high-frequency side, thereby exhibiting greatly improved transmission properties.

The above and other elements, characteristics, features, and advantages of the present invention will become clear from the following description of preferred embodiments taken in conjunction with the accompanying drawings.

DETAILED DESCRIPTION OF PREFERRED EMBODIMENTS

First Preferred Embodiment

Figure 1:
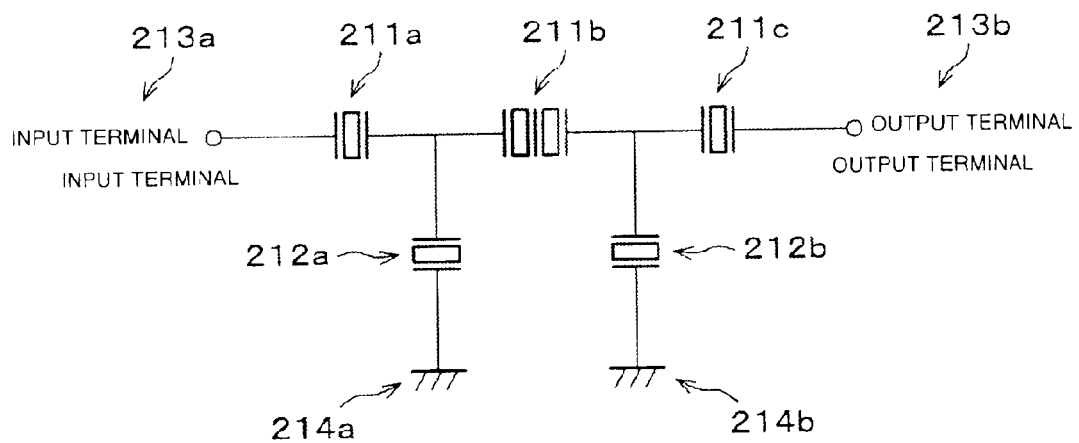
FIG. 1 is a circuit diagram of a surface acoustic wave filter according to preferred embodiments of the present invention.
Figure 2:
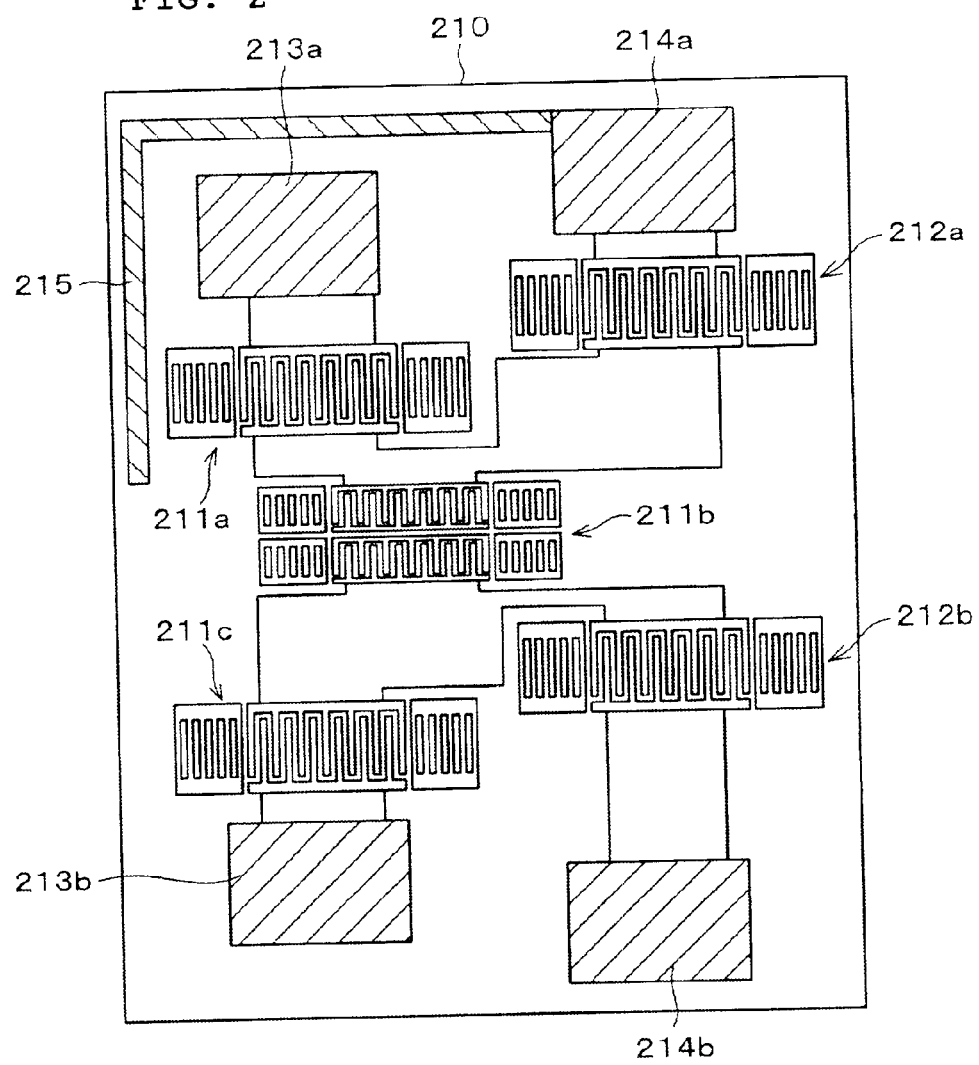
FIG. 2 is a schematic configuration diagram which illustrates a surface acoustic wave filter (trial example A1) according to a first preferred embodiment of the present invention.

Description will be made below regarding a first preferred embodiment of the present invention with reference to FIGS. 1 through 6.

As a surface acoustic wave filter according to the present preferred embodiment, description will be made below regarding a Tx filter with a center frequency in the bass band of 1865 MHz, including a ladder filter. As shown in the circuit diagram in FIG. 1 and schematic configuration diagram in FIG. 2, the surface acoustic filter includes serial resonators 211a through 211c and parallel resonators 212a and 212b disposed in the shape of a ladder. Here, the resonator is a single-port surface acoustic resonator which includes an interdigital transducer (which will be abbreviated to "IDT") having a pair of interdigital transducer electrodes (which will be abbreviated to "IDT electrode" hereafter) and two reflectors disposed with the IDT therebetween in the horizontal direction (surface acoustic wave transmission direction), on a piezoelectric substrate.

The serial resonators 211a through 211c and the parallel resonators 212a and 212b are preferably arranged such that the propagation direction of the surface acoustic waves from these resonators is generally parallel to each other so as to reduce the size of the surface acoustic wave filter.

Furthermore, the serial resonators 211a through 211c are serially connected to one another between the input terminal 213a and the output terminal 213b, and are also arranged so as to be arrayed generally in the direction that is substantially perpendicular to the propagation direction of the surface acoustic waves of the serial resonators 211a through 211c.

On the other hand, the parallel resonators 212a and 212b are each connected between the nodes between the serial resonators 211a through 211c and the grounded electrode pads 214a and 214b, and are arrayed generally in the direction that is substantially perpendicular to the propagation direction of the surface acoustic waves of the parallel resonators 212a and 212b. Furthermore, the parallel resonators 212a and 212b are arranged between the extending lines of surface acoustic wave propagation direction of each of the serial resonators 211a through 211c. The extending lines of the serial resonators are linearly offset from the extending lines of the surface acoustic wave propagation direction of each of the parallel resonators 212a and 212b. The parallel resonators 212a and 212b are arranged generally parallel to the surface acoustic waves from the serial resonators 211a through 211c but are linearly offset therefrom. The surface acoustic wave propagation direction of the serial resonators 211a through 211c is not aligned with that of the parallel resonators 212a and 212b.

The configuration of the above-described surface acoustic filter begins at the serial resonator 211a on the side of the input terminal 213a, and ends at the serial resonator 211c on the side of the output terminal 213b, to produce a T-shaped configuration. In the present specification, a configuration wherein the input and the output each begin from serial resonators will be referred to as a "T-shaped configuration", regardless of the combination of the serial and parallel resonators between the input and the output.

In the present preferred embodiment, three serial resonators 211a, 211b, and 211c, and two parallel resonators 212a and 212b, are provided on the piezoelectric substrate 210 which is preferably formed of a 36°-Y-cut-X-transmission LiTaO$_3$ with photolithography and etching processes.

Each of the serial resonators 211a and 211c have an IDT interlacing width of about 40 µm, 100 IDT electrode pairs, 30 reflector lines (reflector electrode line number). The serial reflector 211b includes two serial resonators which are serially connected, wherein one serial resonator has an IDT interlacing width of about 30 µm, 103 IDT electrode pairs, and 40 reflector lines, and the other serial resonator has an IDT interlacing width of about 28 µm, 110 IDT electrode pairs, and 40 reflector lines.

Furthermore, each of the parallel resonators 212a and 212b have an IDT interlacing width of about 43 µm, 135 IDT electrode pairs, 30 reflector lines.

Figure 3:
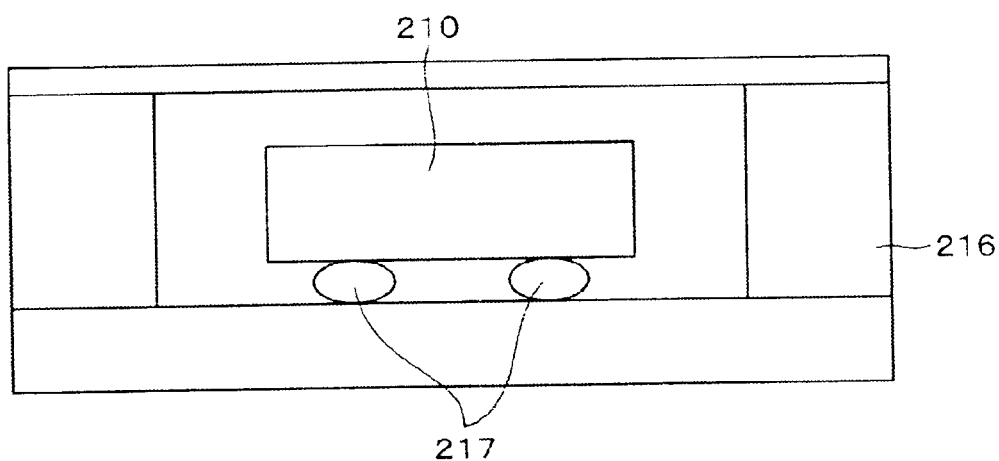
FIG. 3 is a cross-sectional diagram which illustrates the aforementioned surface acoustic wave filter encased in a package.

As shown in FIG. 3, the above-described surface acoustic wave filter and a package 216 are electrically connected via the input/output electrode pads 213a and 213b and the grounded electrode pads 214a and 214b of the surface acoustic filter and is subjected to flip chip bonding with bumps 217 made of a conductive metal.

Furthermore, in the present preferred embodiment, a grounded electrode pattern 215 is provided on the piezoelectric substrate 210 so as to be connected to the grounded electrode pad 214a. The grounded electrode pattern 215 is disposed so as to surround the input electrode pad 213a and the line between the input electrode pad 213a and the serial resonator 211a. Note that "the grounded electrode pattern surrounding the electrode pad" means the grounded electrode pattern surrounds the electrode pad along with the lines for connecting the resonators. The grounded electrode pattern surrounds the electrode pad, and thus, the region where the electrode pad is provided is separated from other regions.

Furthermore, in the present preferred embodiment, the above-described serial resonators 211a through 211c are provided on the piezoelectric substrate 210 so as to be arrayed generally in the direction that is substantially perpendicular to the transmission direction of the surface acoustic waves. Thus, the surface acoustic filter has a compact configuration.

An arrangement having the configuration of the above-described surface acoustic wave filter will be referred to as "trial example A1". As a comparative example of the trial example A1, an arrangement which does not include the aforementioned grounded electrode pattern will be referred to as "trial example B1". With the trial example A1, the grounded electrode pattern 215 is arranged so as to surround the input electrode pad 213a, and is in close proximity to the input electrode pad 213a.

Figure 4:
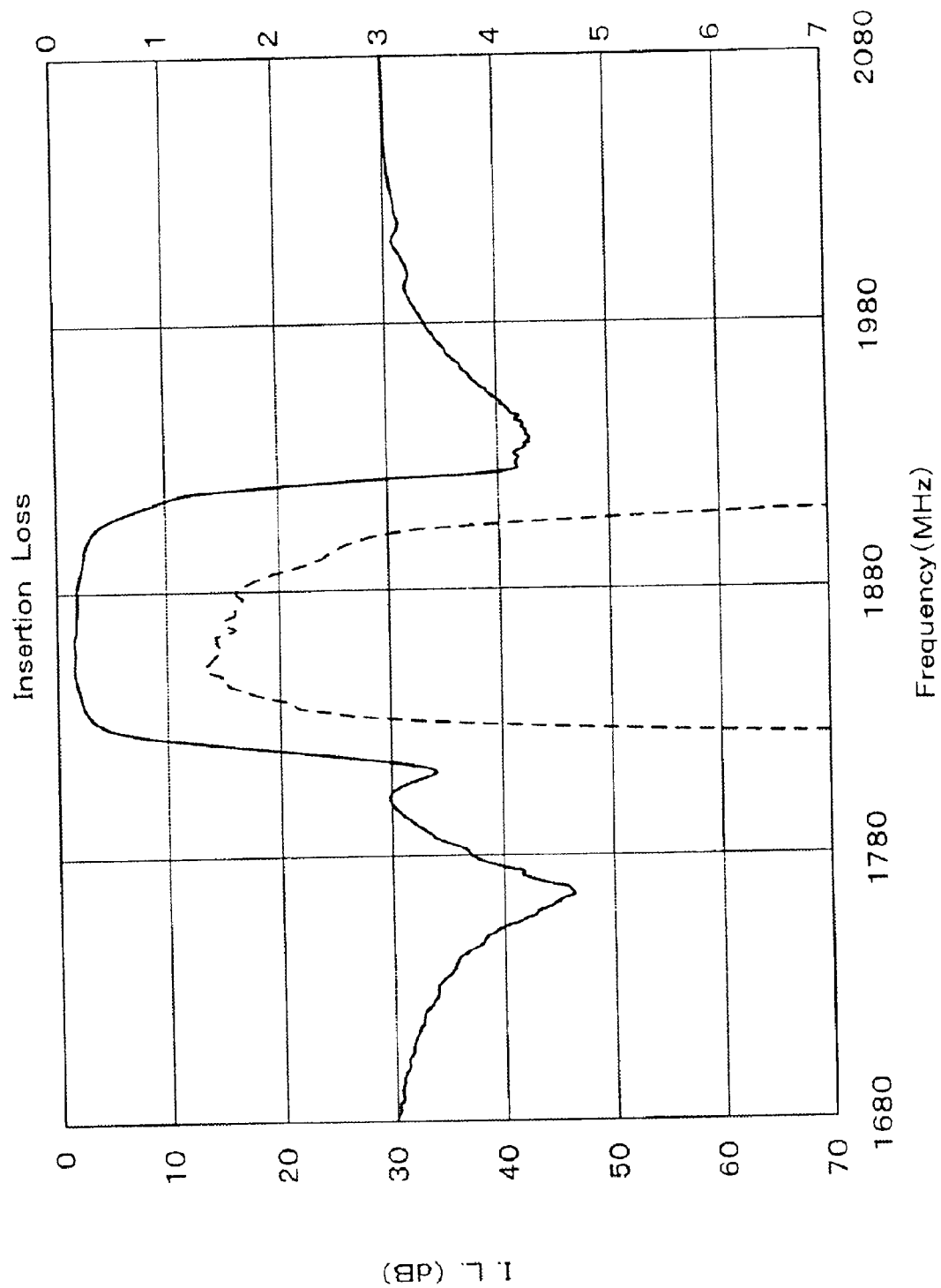
FIG. 4 is a chart which indicates electric properties of the aforementioned trial example A1.
Figure 5:
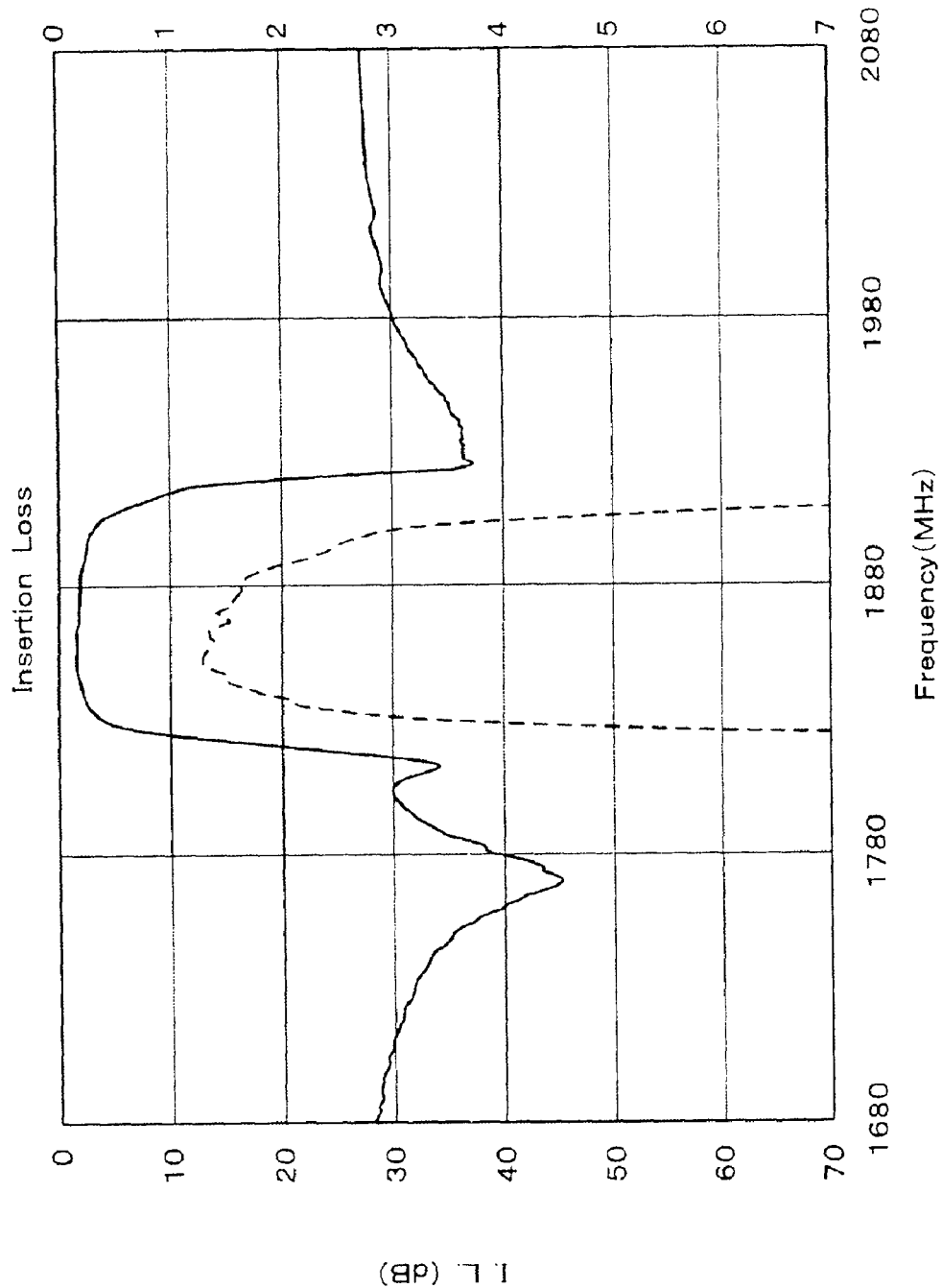
FIG. 5 is a chart which indicates electric properties of a surface acoustic wave filter (trial example B1) as a comparative example as to the aforementioned trial example A1.

FIG. 4 shows the electrical properties of the trial example A1. On the other hand, FIG. 5 shows the electrical properties of the trial example B1. The electrical properties are shown in the frequency range between 1680 MHz and 2080 MHz. By comparing the trial example A1 to the trial example B1, it is clear that the trial example A1 exhibits greater attenuation near the pass band on the high-frequency side than with the trial example B1, and with the trial example A1, attenuation in the Rx band is improved by about 7 dB.

One reason the attenuation is improved is that in the trial example A1, the input electrode pad 213a is surrounded by the grounded electrode pattern 215, thereby reducing direct waves between the input electrode pad 213a and the output electrode pad 213b (in particular, a direct wave which is transmitted by making a detour around the perimeter (edge) of the piezoelectric substrate 210). With the trial example B1, the input electrode pad 213a is not surrounded by the grounded electrode pattern 215, and accordingly, the direct waves between the input electrode pad 213a and the output electrode pad 213b directly influence the properties of the surface acoustic wave filter. Of the electrical properties, attenuation near the pass band on the high-frequency side is the most sensitive to the direct waves, wherein the increase of the direct waves reduces the attenuation, and the decrease of the direct waves increases the attenuation.

The other reason that the attenuation is improved is due to the capacitance produced between the input electrode pad 213a and the grounded electrode pattern 215. That is to say, with the trial example A1, the input electrode pad 213a is in close proximity to the grounded electrode pattern 215, and accordingly, capacitance is produced between the input electrode pad 213a and the grounded electrode pattern 215. With a ladder filter, capacitance produced between the input (output) electrode and the grounded electrode influences attenuation near the pass band on the high-frequency side, i.e., the greater the capacitance is, the greater the attenuation near the pass band on the high-frequency side is. On the other hand, the trial example B1 does not have the advantage of the capacitance. That is to say, the trial example A1 exhibits greater attenuation near the pass band on the high-frequency side than with the trial example B1 due to the effects of the combination of the above-described reduction of the direct waves and the effect of the capacitance produced between the input electrode and the grounded electrode.

Note that while, in the present preferred embodiment, a piezoelectric substrate formed of 36°-Y-cut-X-transmission LiTaO$_3$ is preferably provided, the present invention is not restricted to a particular type of piezoelectric substrate, and 36°-Y-cut-X-transmission LiTaO$_3$ through 46°-Y-cut-X-transmission LiTaO$_3$, or 64°-Y-cut-X-transmission LiNbO$_3$ through 72°-Y-cut-X-transmission LiNbO$_3$, may be used as the piezoelectric substrate. Furthermore, while, in the present preferred embodiment, a T-shaped circuit configuration is preferably provided, an Π-shaped circuit configuration wherein each of the input and the output begin from parallel resonators, a configuration wherein the input begins from a serial resonator and the output begins from a parallel resonator, or a configuration wherein the output begins from a serial resonator and the input begins from a parallel resonator, may be provided. Furthermore, while, in the present preferred embodiment, the grounded electrode pattern is arranged so as to be in close proximity to and to surround the input electrode pad, the present invention is not restricted to the aforementioned configuration. A configuration wherein the grounded electrode pattern is arranged so as to be in close proximity to and to surround the output electrode pad yields similar effects. Furthermore, the electrode formation method used in the present invention is not restricted to a particular formation method, and etching described in the present preferred embodiment, or lift-off processing, or other suitable process, may be used. Furthermore, the bonding method used in the present invention is not restricted to flip chip bonding, and other bonding methods such as wire bonding or other suitable methods may be used.

As described above, the grounded electrode pattern is arranged so as to surround the input electrode pad or the output electrode pad, and accordingly, direct waves between the input electrode pad and the output electrode pad are reduced, thereby providing a small-sized surface acoustic wave filter with greatly improved attenuation near the pass band on the high-frequency side.

Furthermore, at the same time, the grounded electrode pattern is arranged so as to be in close proximity to and surround the input electrode pattern or the output electrode pattern, and accordingly, capacitance is produced between the input electrode and the grounded electrode pattern, or between the output electrode and the grounded electrode pattern, thereby further increasing attenuation near the pass band on the high-frequency side.

Second Preferred Embodiment

Figure 9:
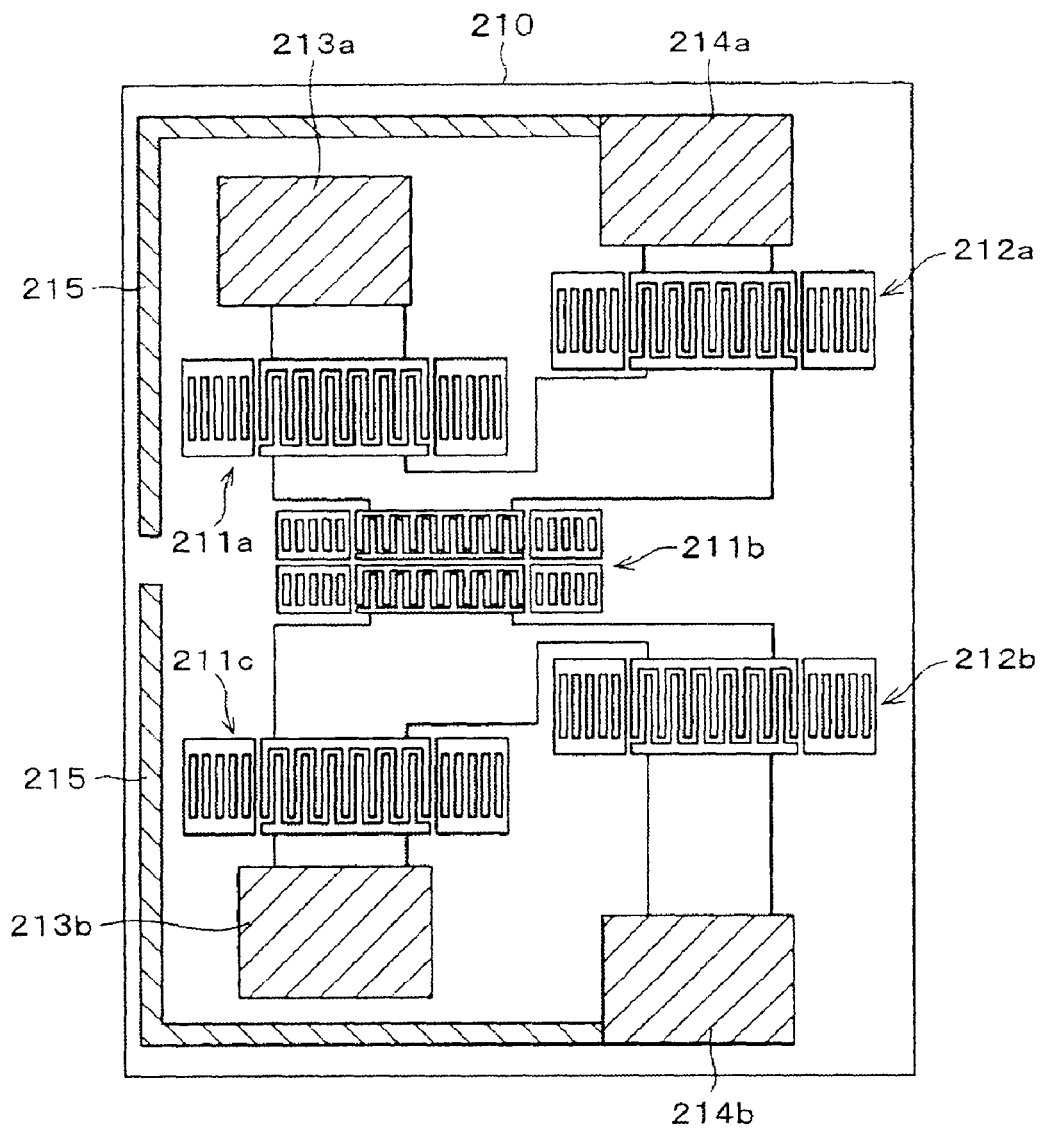
FIG. 9 is a schematic configuration diagram which illustrates another modification of the surface acoustic wave filter according to the second preferred embodiment of the present invention.

Another preferred embodiment will now be described with reference to FIGS. 1, 3, and 9. Note that for convenience of description, the components having the same functions as with the above-described first preferred embodiment are denoted by the same reference numerals, and description thereof is omitted.

A surface acoustic wave filter of the present preferred embodiment has the same circuit configuration as the first preferred embodiment shown in FIG. 1, and the bonding method for the package shown in FIG. 3 is used. Furthermore, the same electrode formation method and electrode configuration for each device, as with the first preferred embodiment, are used.

Figure 6:
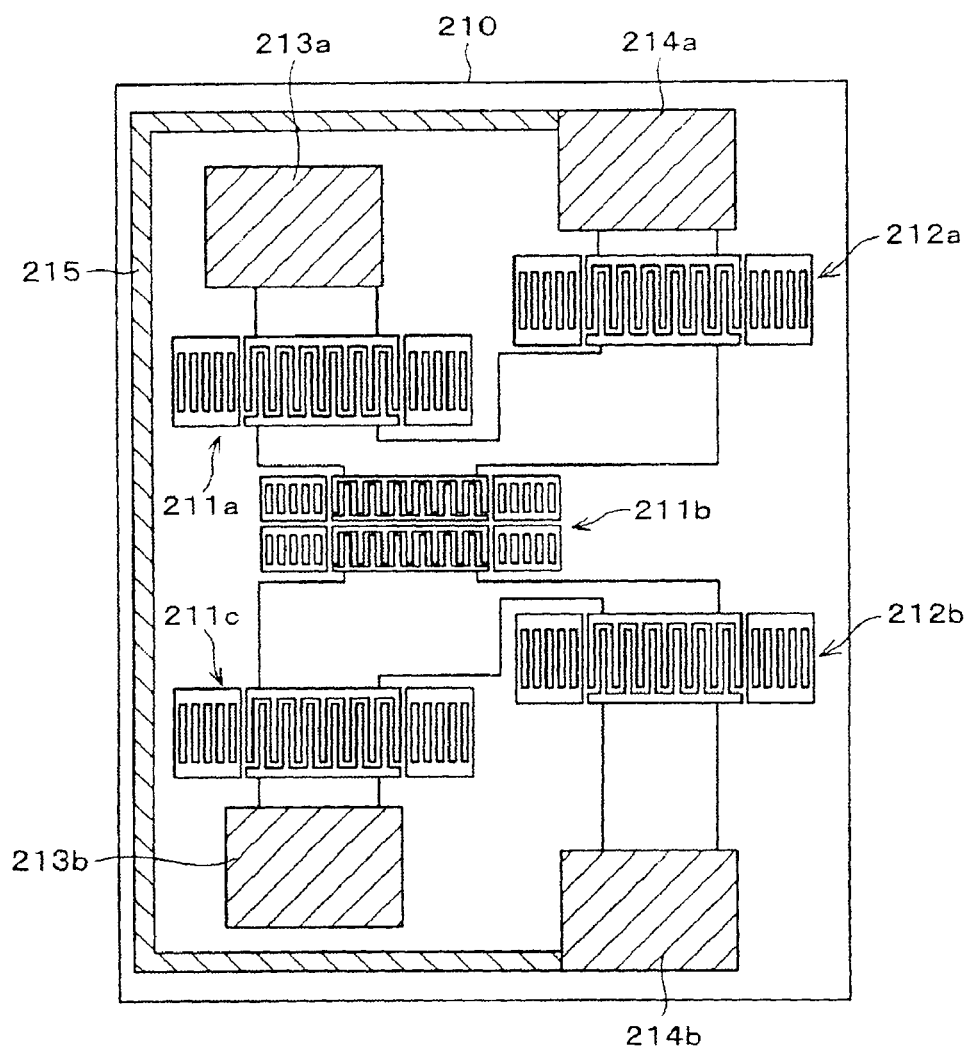
FIG. 6 is a schematic configuration diagram which illustrates a surface acoustic wave filter (trial example C1) according to a second preferred embodiment of the present invention.

Furthermore, the surface acoustic wave filter according to the present preferred embodiment includes the grounded electrode pattern 215 connected to the grounded electrode pads 214a and 214b that is disposed so as to surround the input electrode pad 213a and the output electrode pad 213b, as shown in FIG. 6. With the present preferred embodiment, the grounded electrode pattern 215 is provided along the edge of the piezoelectric substrate 210. Such a configuration shown in FIG. 6 will be referred to as "trial example C1". With the trial example C1, the grounded electrode pattern 215 is disposed so as to surround and be in close proximity to the input electrode pad 213a and the output electrode pad 213b. As a comparative example, the trial example B1 according to the first preferred embodiment will be used.

Figure 7:
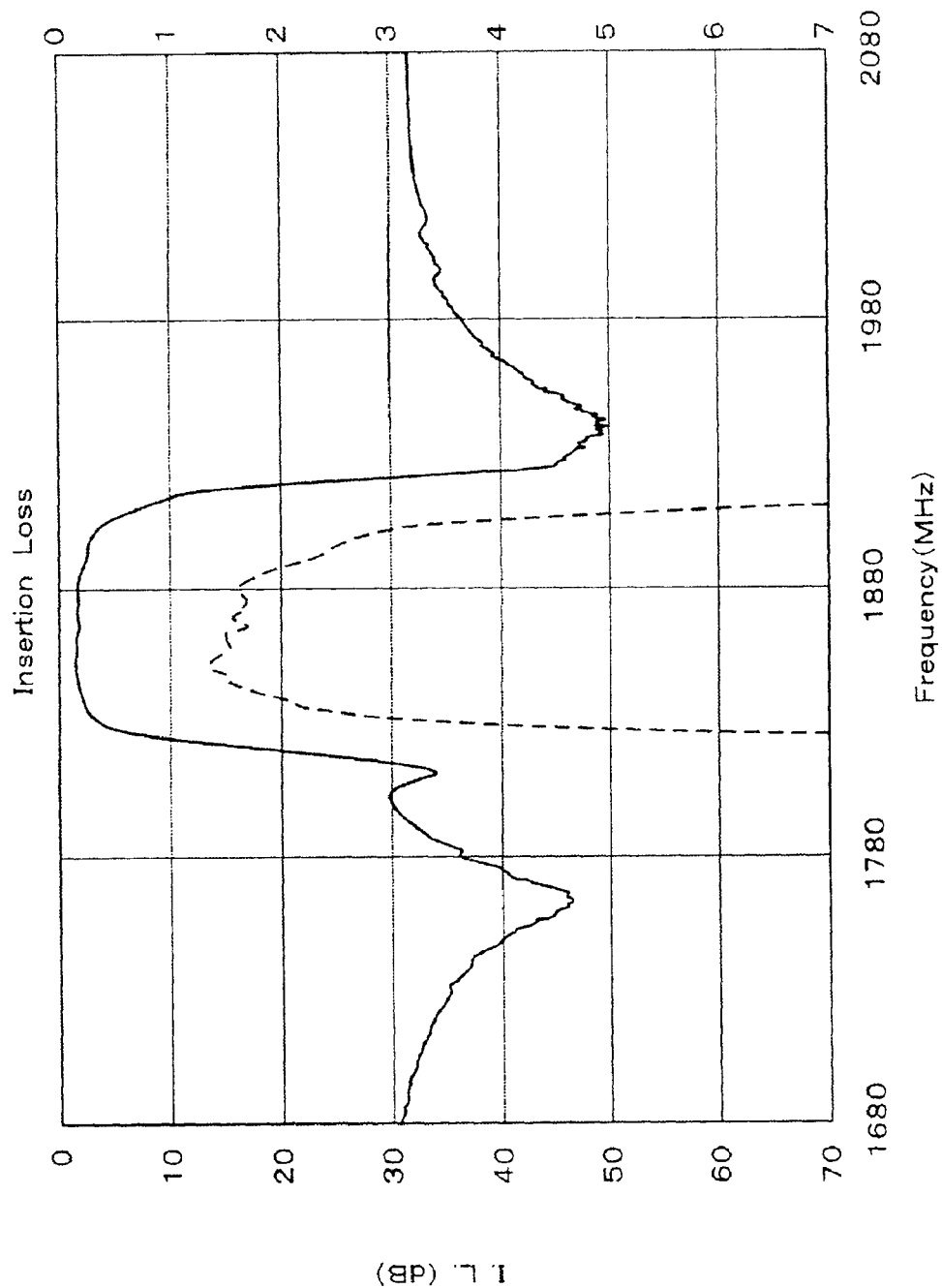
FIG. 7 is a chart which indicates electric properties of the trial example C.

FIG. 7 shows the electrical properties of the trial example C1. On the other hand, FIG. 5 shows the electrical properties of the trial examples B1. The electrical properties are shown in the frequency range between 1680 MHz and 2080 MHz. By comparing the trial example C1 and the trial example B1, it is clear that the trial example C1 exhibits greater attenuation near the pass band on the high-frequency side than with the trial example B1, and with the trial example C1, attenuation in the Rx band is improved by at least about 10 dB. Furthermore, as compared with the trial example A1 of the first preferred embodiment, the trial example C1 exhibits improved attenuation near the pass band on the high-frequency side.

One reason that the attenuation is improved is that, with the trial example C1, the input electrode pad 213a and the output electrode pad 213b are surrounded by the grounded electrode pattern 215, thereby reducing direct waves between the input electrode pad 213a and the output electrode pad 213b (in particular, a direct wave which is transmitted by making a detour around the perimeter (edge) of the piezoelectric substrate 210). With the trial example B1, the input electrode pad 213a and the output electrode pad 213b are not surrounded by the grounded electrode pattern 215, and accordingly, the direct waves between the input electrode pad 213a and the output electrode pad 213b directly influence the properties of the surface acoustic wave filter. Of the electrical properties, attenuation near the pass band on the high-frequency side is the most sensitive to the direct wave, wherein the increase of the direct wave reduces the attenuation, and the decrease of the direct wave increases the attenuation.

The other reason that the attenuation is improved is due to the capacitance produced between the input electrode pad 213a and the grounded electrode pattern 215, and between the output electrode pad 213b and the grounded electrode pattern 215. That is to say, with the trial example C1, the input electrode pad 213a and the output electrode pad 213b are in close proximity to the grounded electrode pattern 215, and accordingly, capacitance is produced between the input electrode pad 213a and the grounded electrode pattern 215, and between the output electrode pad 213b and the grounded electrode pattern 215. With a ladder filter, capacitance produced between the input (output) electrode and the grounded electrode influences attenuation near the pass band on the high-frequency side, i.e., the greater the capacitance is, the greater the attenuation near the pass band on the high-frequency side is. On the other hand, the trial example B1 does not have the advantage of the capacitance.

The trial example C1 exhibits greater attenuation near the pass band on the high-frequency side than with the trial example B1 due to the effects of the combination of the above-described reduction of the direct waves and the effect of the capacitance produced between the input/output electrodes and the grounded electrode.

Furthermore, as compared with the trial example A1, the trial example C1 exhibits improved attenuation near the pass band on the high-frequency side. This is because, with the trial example C1, both the input electrode pad 213a and the output electrode pad 213b are surrounded by the grounded electrode pattern 215, thereby reducing the direct waves between the input electrode pad 213a and the output electrode pad 213b. With the trial example A1, only the input electrode pad 213a is surrounded by the grounded electrode pattern 215, and accordingly, the trial example A1 exhibits a smaller reduction of the direct waves between the input electrode pad 213a and the output electrode pad 213b than with the trial example C1. That is to say, the trial example C1 further reduces the direct waves than with the trial example A1.

Furthermore, the trial example C1 has greater capacitance between the input and output electrodes and the grounded electrode as compared with the trial example A1. Accordingly, the trial example C1 has even greater effects of the combination of the reduction of direct waves and the effect of the capacitance produced between the input and output electrodes and the grounded electrode. Thus, the trial example C produces greater attenuation near the pass band on the high-frequency side than with the trial example A1.

Figure 8:
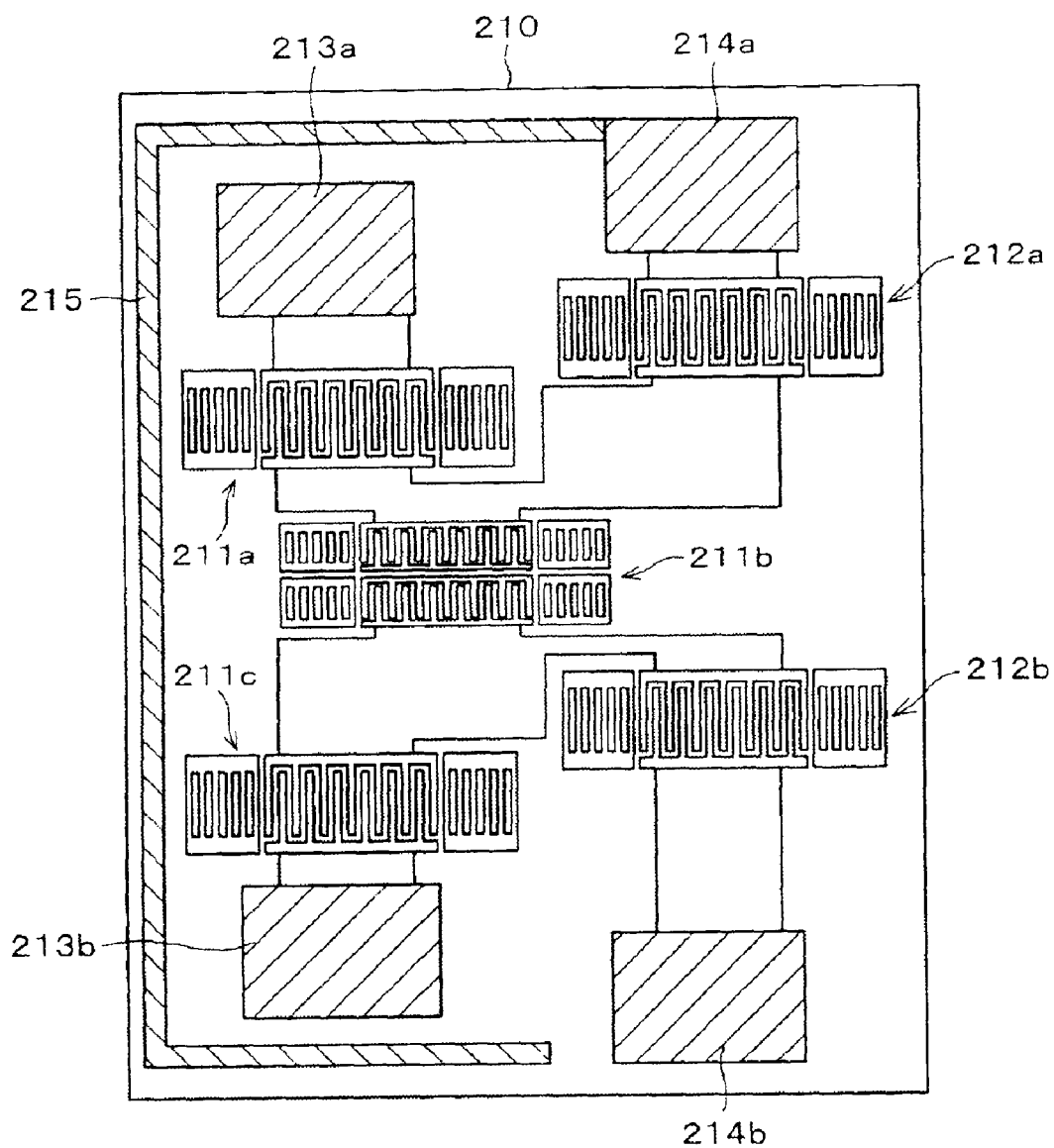
FIG. 8 is a schematic configuration diagram which illustrates a modification of the surface acoustic wave filter according to the second preferred embodiment of the present invention.

Note that, while, with the present preferred embodiment, a piezoelectric substrate formed of 36°-Y-cut-X-transmission LiTaO₃ is preferably provided, the present invention is not restricted to a particular type of piezoelectric substrate, and 36°-Y-cut-X-transmission LiTaO₃ through 46°-Y-cut-X-transmission LiTaO₃, or 64°-Y-cut-X-transmission LiNbO₃ through 72°-Y-cut-X-transmission LiNbO₃, may be provided as the piezoelectric substrate. Furthermore, while, with the present preferred embodiment, a T-shaped circuit configuration is preferably provided, an Π-shaped circuit configuration wherein each of the input and the output begin from parallel resonators, a configuration wherein the input begins from a serial resonator and the output begins from a parallel resonator, or a configuration wherein the output begins from a serial resonator and the input begins from a parallel resonator, may be provided. Furthermore, the grounded electrode pattern may be connected to all the grounded electrode pads as shown in FIG. 6, for example, or the grounded electrode pattern may be connected to only one grounded electrode pad as shown in FIG. 8. Furthermore, the grounded electrode pattern may be separated into two grounded electrode patterns 215 as shown in FIG. 9. With all the configurations described above, attenuation near the pass band on the high-frequency side is greatly improved. Furthermore, the electrode formation method used in the present invention is not restricted to a particular formation method, and etching or lift-off processing or other suitable process may be used. Furthermore, the bonding method used in the present invention is not restricted to flip chip bonding, and other bonding methods such as wire bonding or other suitable methods may be used.

As described above, the grounded electrode pattern is arranged so as to surround the input electrode pad and the output electrode pad, and accordingly, direct waves between the input electrode pad and the output electrode pad are greatly reduced, thereby providing a small-sized surface acoustic wave filter with even greater attenuation near the pass band on the high-frequency side.

Furthermore, at the same time, the grounded electrode pattern is arranged so as to be in close proximity to and surround the input electrode pattern and the output electrode pattern, and accordingly, capacitance is produced between the input electrode and the grounded electrode pattern, and between the output electrode and the grounded electrode pattern, thereby further increasing attenuation near the pass band on the high-frequency side.

Third Preferred Embodiment

Another preferred embodiment will be described with reference to FIGS. 1 and 3, FIGS. 5 through 7, and FIGS. 10 through 13. Note that for convenience of description, the components having the same functions as with the above-described first and second preferred embodiments are denoted by the same reference numerals, and description thereof is omitted.

A surface acoustic wave filter of the present preferred embodiment preferably has the same circuit configuration as with the first preferred embodiment shown in FIG. 1, and the bonding method for the package shown in FIG. 3 is preferably used. Furthermore, the same electrode formation method and electrode configuration for each device, as with the first preferred embodiment, are used.

Figure 10:
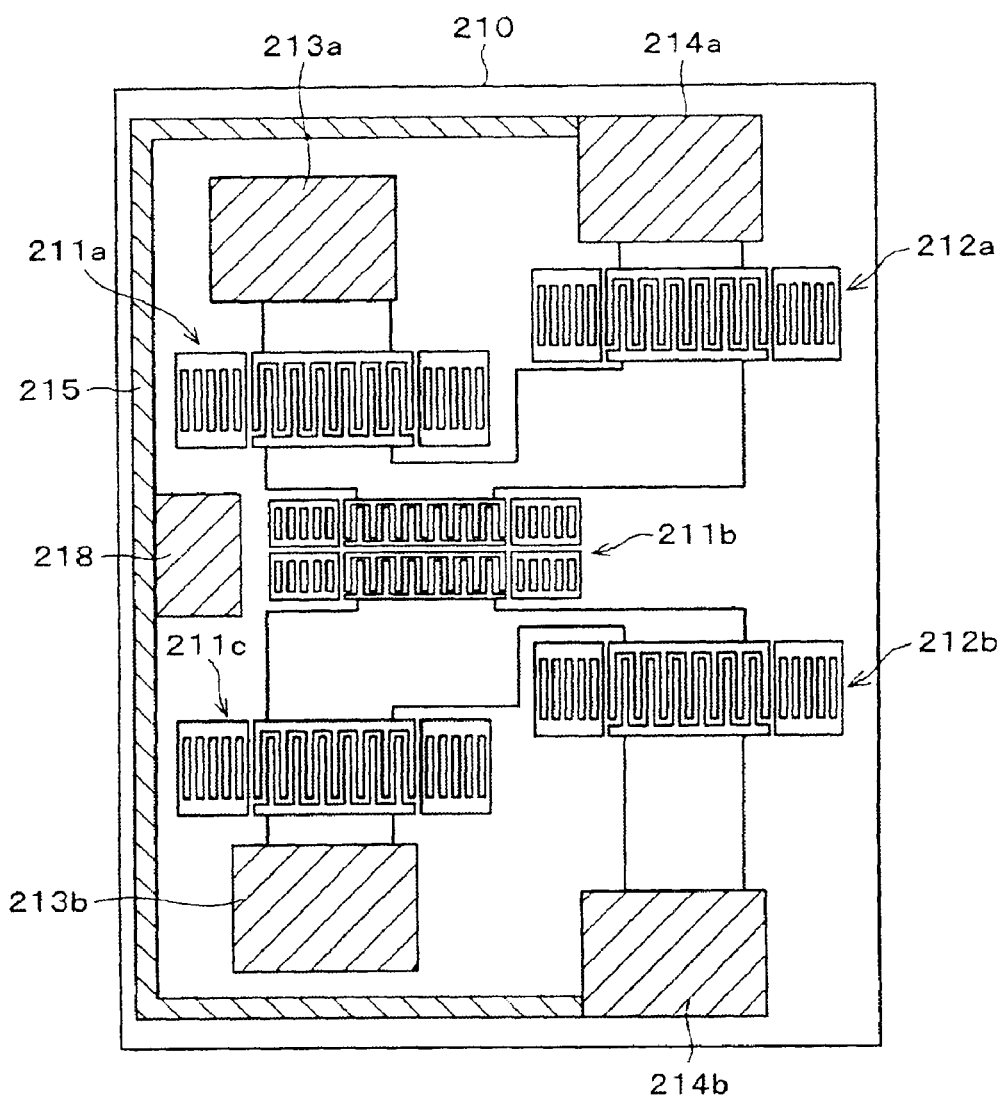
FIG. 10 is a schematic configuration diagram which illustrates a surface acoustic wave filter (trial example D1) according to a third preferred embodiment of the present invention.

Furthermore, the surface acoustic wave filter of the present preferred embodiment has a configuration wherein the surface acoustic wave filter according to the second preferred embodiment shown in FIG. 6 further includes an electrode pattern 218 as shown in FIG. 10. That is to say, with the surface acoustic wave filter of various preferred embodiments of the present invention, the grounded electrode pattern 215 connected to the grounded electrode pads 214a and 214b is arranged so as to surround the input electrode pad 213a and the output electrode pattern 213b. Furthermore, the aforementioned grounded electrode pattern 218 is provided between the input electrode pad 213a and the output electrode pad 213b. That is to say, the input electrode pattern 213a and the output electrode pattern 213b are individually surrounded by the grounded electrode pattern 218 and the grounded electrode pattern 215.

A configuration of the surface acoustic wave filter shown in FIG. 10 will be referred to as "trial example D1". With the trial example D1, the grounded electrode pattern 215 is arranged so as to surround the input electrode pad 213a and the output electrode pad 213b, and furthermore, the grounded electrode pattern 218 is arranged such that the input electrode pad 213a and the output electrode pad 213b are individually surrounded by the grounded electrode pattern 218. The grounded electrode pattern 215 is arranged so as to be close to the input electrode pad 213a and the output electrode pad 213b. As a comparative example as to the trial example D1, the trial example B1 described in the first preferred embodiment is used.

Figure 11:
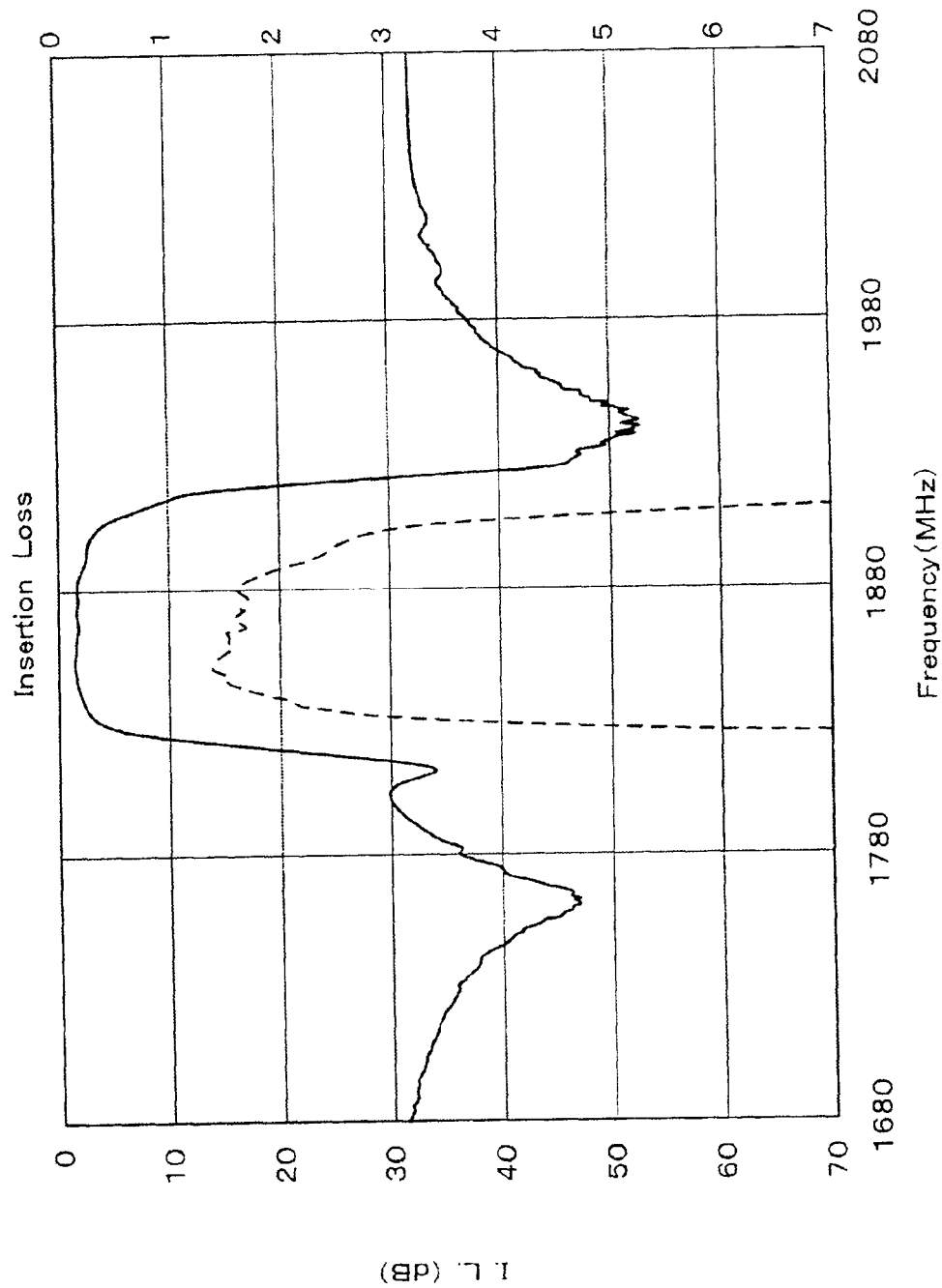
FIG. 11 is a chart which indicates electric properties of the trial example D1.

FIG. 11 shows the electrical properties of the trial example D1. On the other hand, FIG. 5 shows the electrical properties of the trial examples B1. The electrical properties are shown in the frequency range between 1680 MHz and 2080 MHz. Making a comparison between the trial example D1 and the trial example B1, it is clear that the trial example D1 exhibits greater attenuation near the pass band on the high-frequency side than with the trial example B1, and with the trial example D1, attenuation in the Rx band is improved by at least about 10 dB. Furthermore, as compared with the trial example A1 of the first preferred embodiment, the trial example D1 exhibits improved attenuation near the pass band on the high-frequency side.

One reason that the attenuation is improved is that, with the trial example D1, the input electrode pad 213a and the output electrode pad 213b are surrounded by the grounded electrode pattern 215, and furthermore, the grounded electrode pad 218 is provided between the input electrode pad 213a and the output electrode pad 213b, thereby reducing direct waves between the input electrode pad 213a and the output electrode pad 213b (in particular, a direct wave which is transmitted by making a detour around the perimeter (edge) of the piezoelectric substrate 210). With the trial example B1, the input electrode pad 213a and the output electrode pad 213b are not surrounded by the grounded electrode pattern 215, the grounded electrode pattern 218 is not provided between the input electrode pad 213a and the output electrode pad 213b, and accordingly, the direct waves between the input electrode pad 213a and the output electrode pad 213b directly influence the properties of the surface acoustic wave filter. Of the electrical properties, attenuation near the pass band on the high-frequency side is the most sensitive to the direct wave, wherein the increase of the direct wave reduces the attenuation, and the decrease of the direct wave increases the attenuation.

The other reason that the attenuation is improved is due to the capacitance produced between the input electrode pad 213a and the grounded electrode pattern 215, and between the output electrode pad 213b and the grounded electrode pattern 215. That is to say, with the trial example D1, the input electrode pad 213a and the output electrode pad 213b are in close proximity to the grounded electrode pattern 215, and accordingly, capacitance is produced between the input electrode pad 213a and the grounded electrode pattern 215, and between the output electrode pad 213b and the grounded electrode pattern 215. With a ladder filter, capacitance produced between the input (output) electrode and the grounded electrode influences attenuation near the pass band on the high-frequency side, i.e., the greater the capacitance is, the greater the attenuation near the pass band on the high-frequency side is. On the other hand, the trial example B1 does not have the advantage of the capacitance.

The trial example D1 exhibits greater attenuation near the pass band on the high-frequency side than with the trial example B1 due to the effects of the combination of the above-described reduction of the direct waves and the capacitance produced between the input/output electrodes and the grounded electrode.

Furthermore, as compared with the trial example C1, the trial example D1 exhibits improved attenuation near the pass band on the high-frequency side. This is because, with the trial example D1, in addition to the configuration of the trial example C1, the grounded electrode pattern 218 is further provided, thereby reducing the direct waves between the input electrode pad 213a and the output electrode pad 213b. With the trial example C1, while the input electrode pad 213a and the output electrode pad 213b are surrounded by the grounded electrode pattern 215, the grounded electrode pattern 218 is not provided between the input electrode pad 213a and the output electrode pad 213b, and accordingly, the trial example C1 exhibits less reduction of the direct waves between the input electrode pad 213a and the output electrode pad 213b than with the trial example D1. That is to say, the trial example D1 produces greater reduction of the direct waves than with the trial example C1. Thus, the trial example D1 exhibits greater attenuation near the pass band on the high-frequency side than with the trial example C1.

Figure 12:
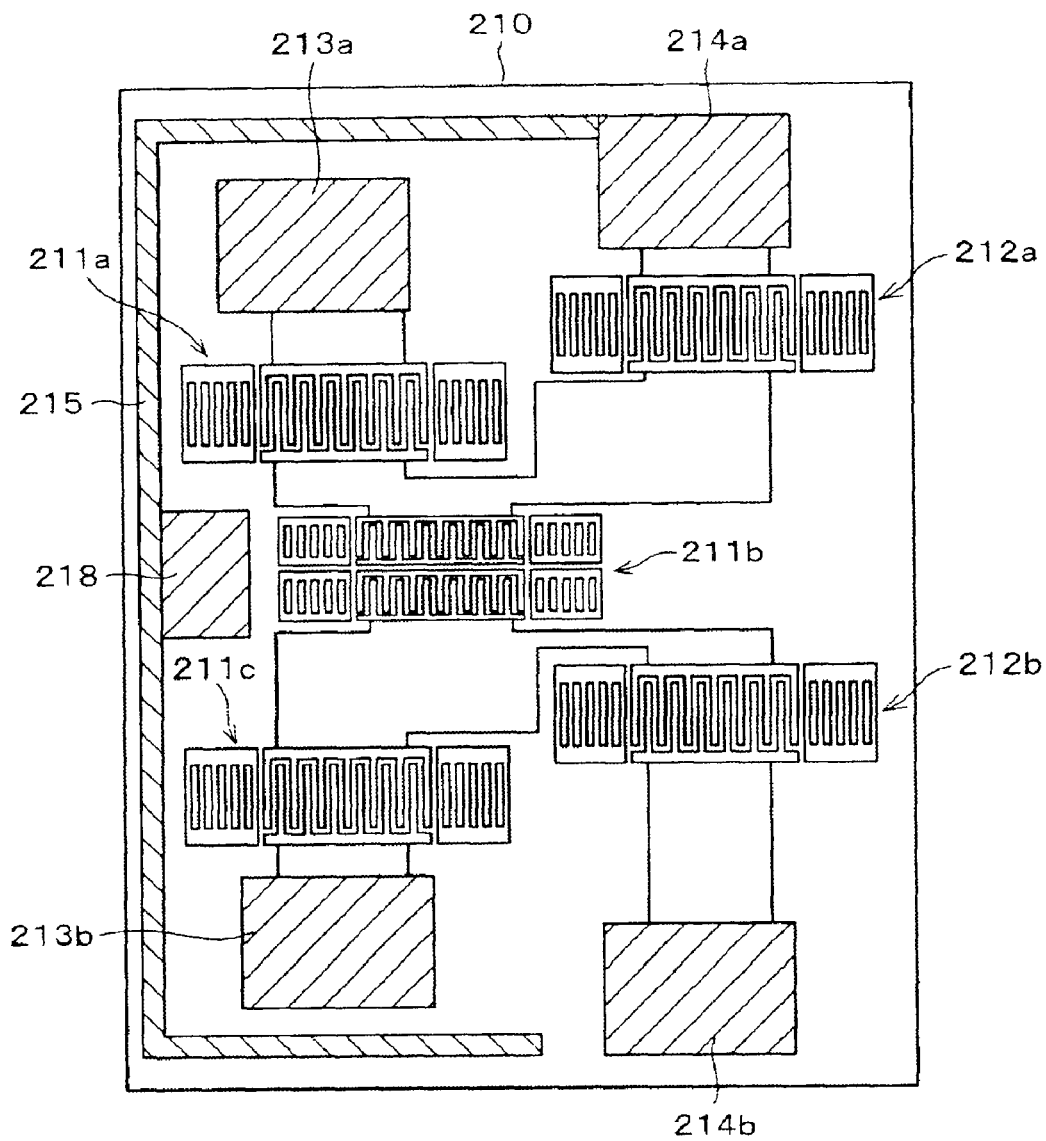
FIG. 12 is a schematic configuration diagram which illustrates a modification of the surface acoustic wave filter according to the third preferred embodiment of the present invention.
Figure 13:
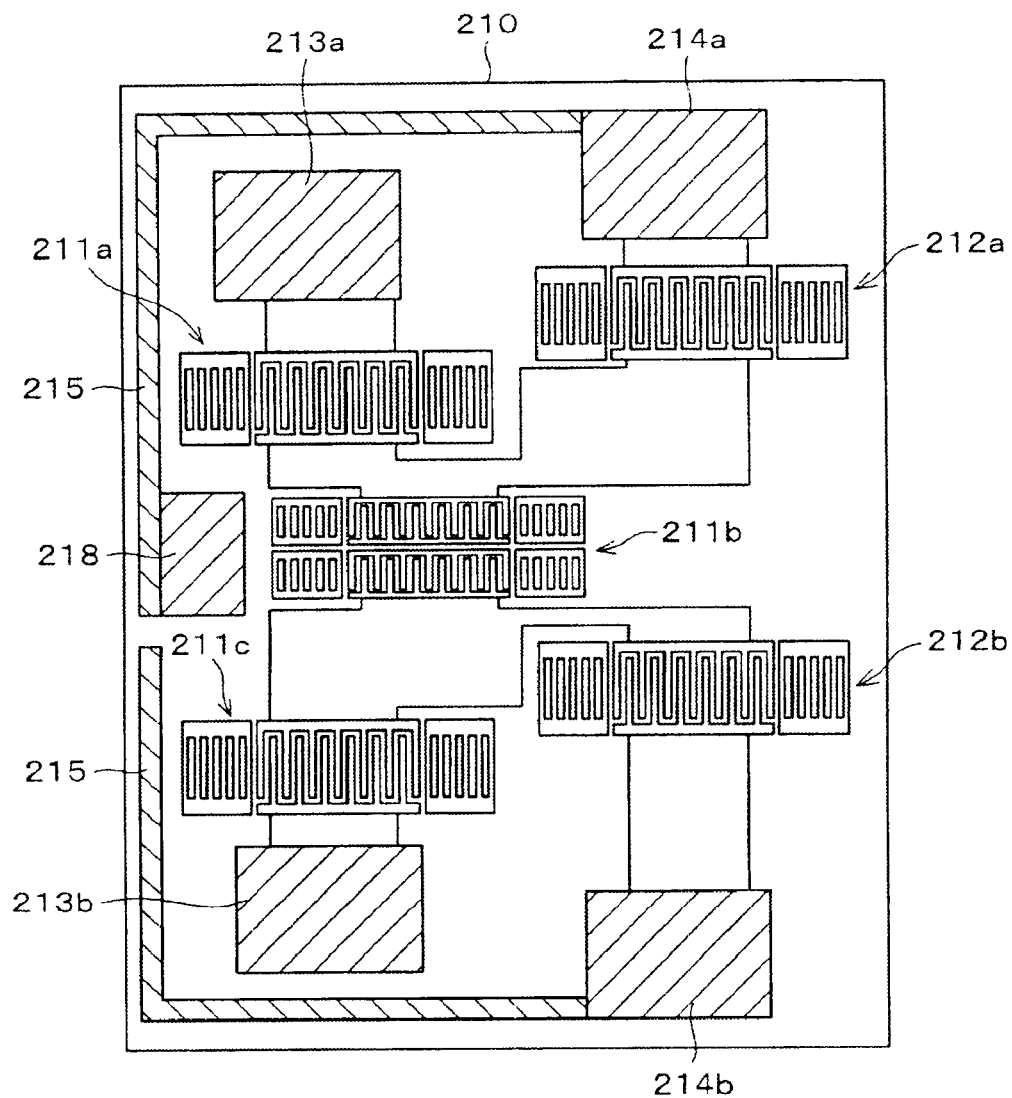
FIG. 13 is a schematic configuration diagram which illustrates another modification of the surface acoustic wave filter according to the third preferred embodiment of the present invention.

Note that, while, with the present preferred embodiment, a piezoelectric substrate formed of 36°-Y-cut-X-transmission LiTaO$_3$ is preferably provided, the present invention is not restricted to a particular type of the piezoelectric substrate, and 36°-Y-cut-X-transmission LiTaO$_3$ through 46°-Y-cut-X-transmission LiTaO$_3$, or 64°-Y-cut-X-transmission LiNbO$_3$ through 72°-Y-cut-X-transmission LiNbO$_3$, may be provided as the piezoelectric substrate. Furthermore, while, with the present preferred embodiment, a T-shaped circuit configuration is preferably provided, a Π-shaped circuit configuration wherein each of the input and the output begin from parallel resonators, a configuration wherein the input begins from a serial resonator and the output begins from a parallel resonator, or a configuration wherein the output begins from a serial resonator and the input begins from a parallel resonator, may be provided. Furthermore, the grounded electrode pattern 215 may be connected to all the grounded electrode pads as shown in FIG. 10, for example, or the grounded electrode pattern 215 may be connected to only one grounded electrode pad as shown in FIG. 12. Furthermore, the grounded electrode pattern 215 may be separated into two grounded electrode patterns as shown in FIG. 13. With all the configurations described above, attenuation near the pass band on the high-frequency side is greatly improved. Furthermore, the electrode formation method used in the present invention is not restricted to a particular formation method, and etching or lift-off processing or other method may be used. Furthermore, the bonding method used in the present invention is not restricted to flip chip bonding, and other bonding methods such as wire bonding or other suitable methods may be used.

As described above, the grounded electrode pattern is arranged so as to surround the input electrode pad and the output electrode pad, and also, the grounded electrode pattern is disposed between the input electrode pad and the output electrode pad, thereby reducing the direct waves directly transmitted between the input electrode pad and the output electrode pad. While the direct waves directly transmitted between the input electrode pad and the output electrode pad is reduced by the IDTs disposed between the input electrode pad and the output electrode pad, in addition to the IDTs, the grounded electrode pattern is disposed between the input electrode pad and the output electrode pad, thereby further reducing the influence of the direct waves directly transmitted.

Furthermore, at the same time, the grounded electrode pattern is arranged so as to be in close proximity to and surround the input electrode pad and the output electrode pad, and accordingly, capacitance is produced between the input electrode and the grounded electrode pattern, and between the output electrode and the grounded electrode pattern, thereby further increasing attenuation near the pass band on the high-frequency side.

Next, description will be made regarding a communication device including the surface acoustic wave filter described in the above preferred embodiments with reference to FIG. 14. A communication device 600 preferably includes an antenna 601, an antenna duplexer/RF top filter 602, an amplifier 603, an Rx inter-stage filter 604, a mixer 605, a first IF filter 606, a mixer 607, a second IF filter 608, a first/second local synthesizer 611, a TCXO (temperature compensated crystal oscillator) 612, a divider 613, and a local filter 614, for a receiver (Rx side) which performs reception.

Figure 14:
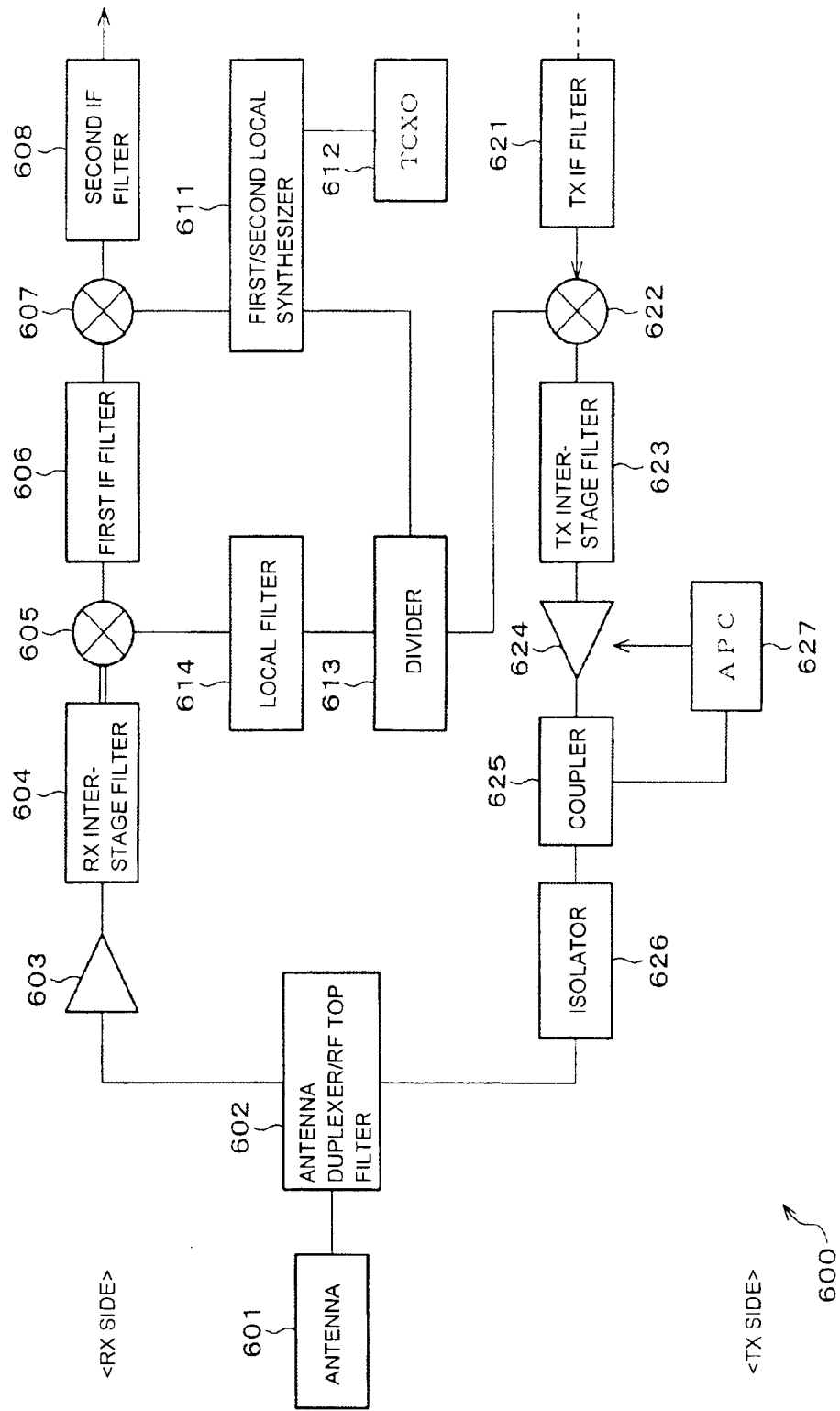
FIG. 14 is a principal component block diagram of a communication device according to another preferred embodiment of the present invention.
Figure 15:
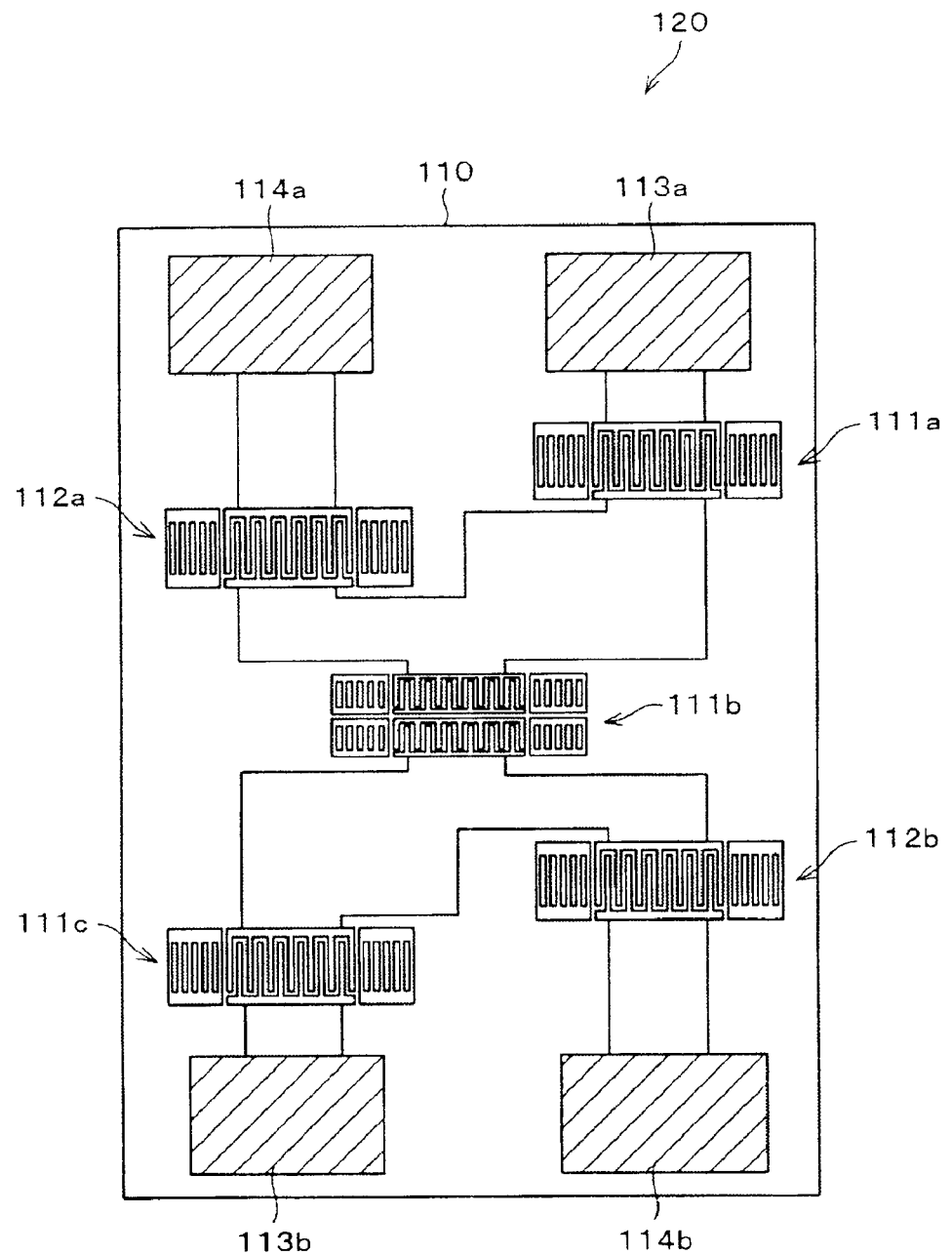
FIG. 15 is a schematic configuration diagram which illustrates a conventional surface acoustic wave filter.
Figure 16:
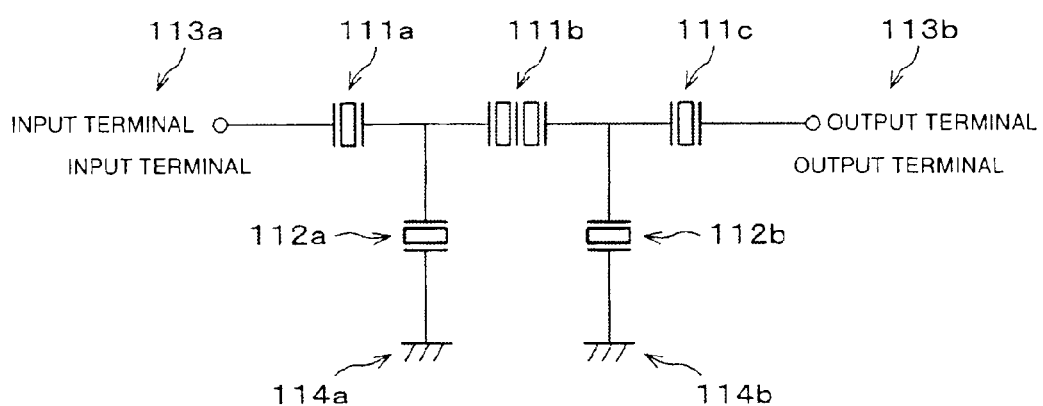
FIG. 16 is a circuit diagram of a conventional surface acoustic wave filter.
Figure 17:
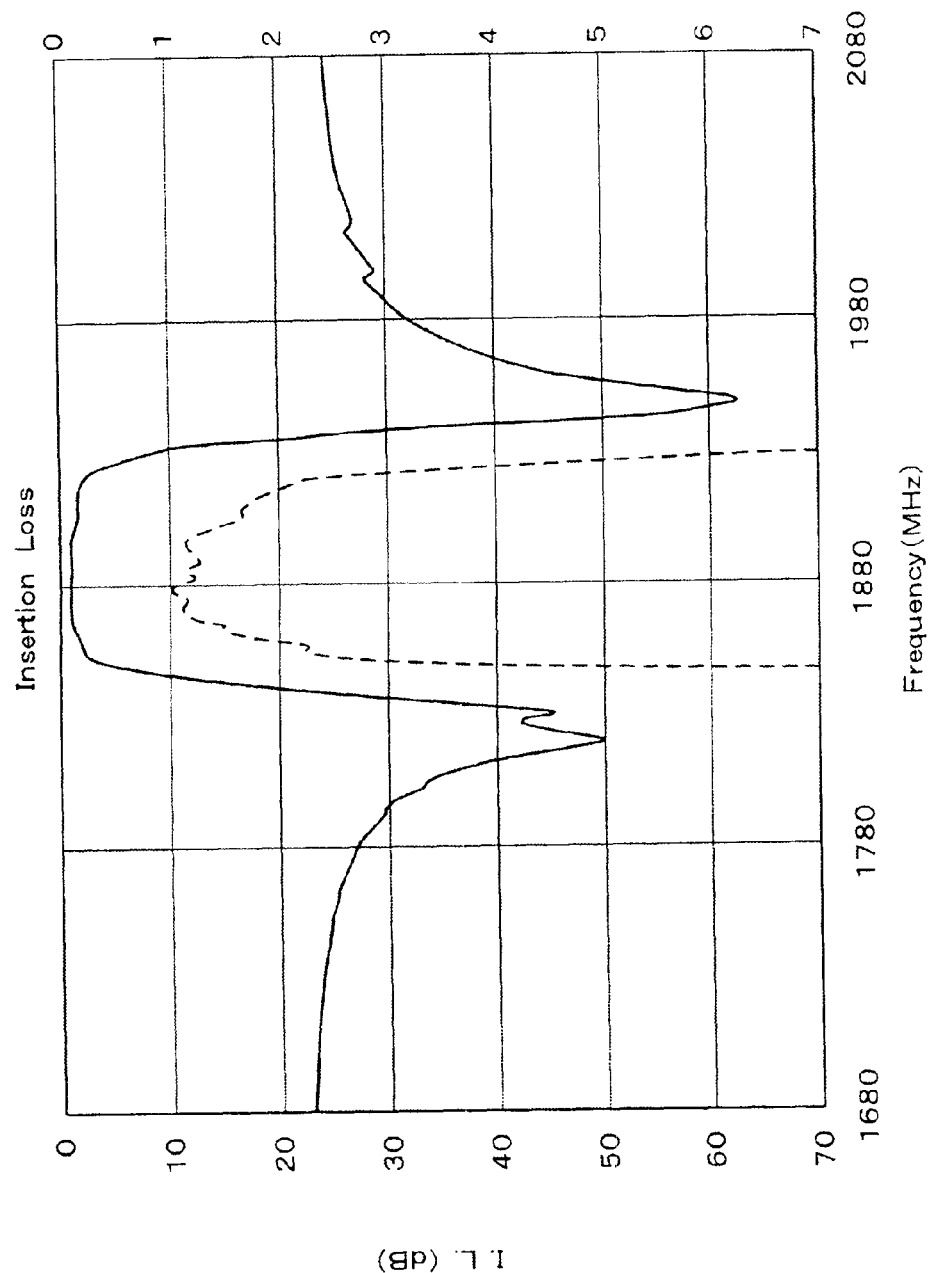
FIG. 17 is a chart which indicates filter properties of the surface acoustic wave filter shown in FIG. 15.
Figure 18:
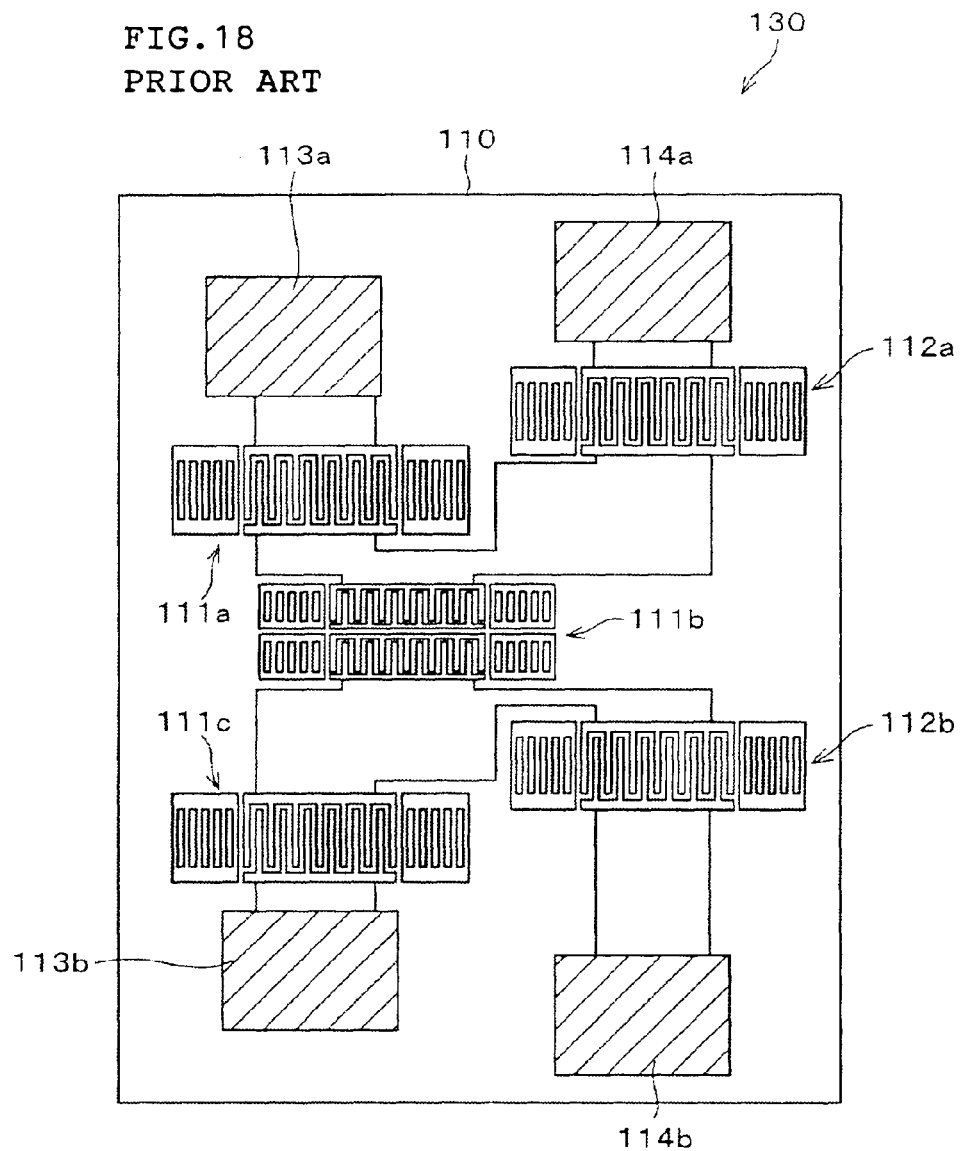
FIG. 18 is a schematic configuration diagram which illustrates a conventional surface acoustic wave filter with a reduced chip size.
Figure 19:
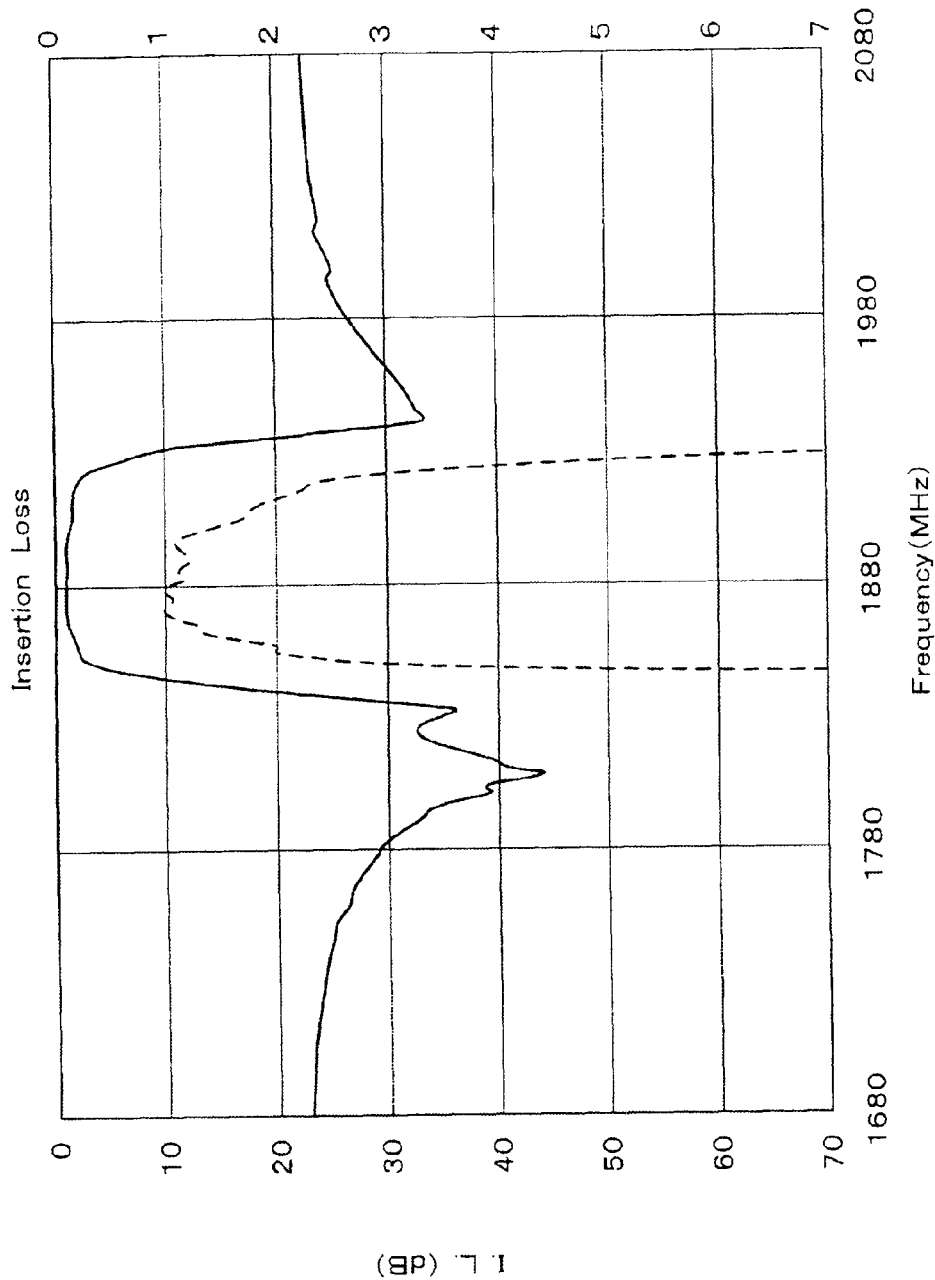
FIG. 19 is a chart which indicates filter properties of the surface acoustic wave filter shown in FIG. 18.

Signals are preferably transmitted from the Rx inter-stage filter 604 to the mixer 605 with balanced signals for ensuring balance, as indicated by a double line in FIG. 14.

Furthermore, the above-described communication device 600 includes the aforementioned antenna 601 and antenna duplexer/RF top filter 602 for a transmitter (Tx side) which performs transmission, as well, and further includes a Tx IF filter 621, a mixer 622, an Tx inter-stage filter 623, an amplifier 624, a coupler 625, an isolator 626, and an APC (automatic power control) 627 for a transmitter.

The surface acoustic wave filter according to various preferred embodiments of the present invention is preferably provided for the aforementioned TX inter-stage filter 623.

The surface acoustic wave filter according to preferred embodiments of the present invention has greatly improved properties of attenuation near the pass band on the high-frequency side as compared with the conventional surface acoustic wave filters. Thus, the communication device of the present invention having the above-described surface acoustic filter exhibits greatly improved transmission properties.

The present invention is not limited to each of the above-described preferred embodiments, and various modifications are possible within the range described in the claims. An embodiment obtained by appropriately combining technical means disclosed in each of the different preferred embodiments is included in the technical scope of the present invention.

What is claimed is:

1. A surface acoustic wave filter comprising:
   a piezoelectric substrate having an input electrode pad and an output electrode pad;
   a plurality of serial surface acoustic wave resonators and parallel surface acoustic wave resonators arranged in a ladder configuration between said input electrode pad and said output electrode pad on said piezoelectric substrate;
   a grounded electrode pad connected to at least one of the plurality of parallel surface acoustic wave resonators; and
   a grounded electrode pattern directly connected to said grounded electrode pad and arranged on said piezoelectric substrate such that the grounded electrode pad and the grounded electrode pattern surround at least one of said input electrode pad and said output electrode pad on at least three sides thereof;
   wherein
   the grounded electrode pattern is provided between at least one of said input electrode pad and said output electrode pad and an edge of said piezoelectric substrate, such that the grounded electrode pattern is spaced from the edge of said piezoelectric substrate.

2. A surface acoustic wave filter according to claim 1, wherein said grounded electrode pad and said grounded electrode pattern are arranged so as to surround both of said input electrode pad and said output electrode pad on at least three sides thereof.

3. A surface acoustic wave filter according to claim 1, wherein a portion of said grounded electrode pattern is disposed between said input electrode pad and said output electrode pad.

4. A communication device comprising the surface acoustic wave filter according to claim 1.

5. A surface acoustic wave filter according to claim 1, wherein said serial surface acoustic wave resonators are arranged so as to be generally linearly arrayed.

6. A surface acoustic wave filter according to claim 1, wherein said serial surface acoustic wave resonators and said parallel surface acoustic wave resonators are arranged in a T-shaped configuration.

7. A surface acoustic wave filter according to claim 1, wherein said piezoelectric substrate is a 36°-Y-cut-X-transmission LiTaO$_3$ substrate.

8. A surface acoustic wave filter according to claim 1, said plurality of serial surface acoustic wave resonators and parallel surface acoustic wave resonators include three serial surface acoustic wave resonators and two parallel surface acoustic wave resonators.

9. A surface acoustic wave filter comprising:
   a piezoelectric substrate having an input electrode pad and an output electrode pad;
   a plurality of serial surface acoustic wave resonators and parallel surface acoustic wave resonators arranged in a ladder configuration between said input electrode pad and said output electrode pad on said piezoelectric substrate; and
   a grounded electrode pad connected to at least one of the plurality of parallel surface acoustic wave resonators;
   a grounded electrode pattern directly connected to said grounded electrode pad and arranged between at least one of said input electrode pad and said output electrode pad and an edge of said piezoelectric substrate, such that the grounded electrode pattern is spaced from the edge of said piezoelectric substrate;
   wherein
   the grounded electrode pattern surrounds at least one of said input electrode pad and said output electrode pad on at least two sides thereof.

10. A surface acoustic wave filter according to claim 9, said plurality of serial surface acoustic wave resonators and parallel surface acoustic wave resonators include three serial surface acoustic wave resonators and two parallel surface acoustic wave resonators.

11. A communication device comprising the surface acoustic wave filter according to claim 9.

12. A surface acoustic wave filter according to claim 9, wherein said grounded electrode pad and said grounded electrode pattern are arranged on said piezoelectric substrate so as to surround at least one of said input electrode pad and said output electrode pad on at least three sides thereof.

13. A surface acoustic wave filter according to claim 9, wherein said grounded electrode pad and said grounded electrode pattern are arranged so as to surround both of said input electrode pad and said output electrode pad on three sides thereof.

14. A surface acoustic wave filter according to claim 9, wherein a portion of said grounded electrode pattern is disposed between said input electrode pad and said output electrode pad.

15. A surface acoustic wave filter according to claim 9, wherein said serial surface acoustic wave resonators are arranged so as to be generally linearly arrayed.

16. A surface acoustic wave filter according to claim 9, wherein said serial surface acoustic wave resonators and said parallel surface acoustic wave resonators are arranged in a T-shaped configuration.

17. A surface acoustic wave filter according to claim 9, wherein said piezoelectric substrate is a 36°-Y-cut-X-transmission LiTaO$_3$ substrate.

* * * * *